(12) United States Patent
Honda et al.

(10) Patent No.: US 8,295,509 B2
(45) Date of Patent: *Oct. 23, 2012

(54) INFORMATION PROCESSING APPARATUS PROCESSING NOTIFICATION SOUND AND AUDIO-BASED CONTENTS, AND INFORMATION PROCESSING METHOD THEREOF

(75) Inventors: Shinichi Honda, Kanagawa (JP); Kosei Yamashita, Kanagawa (JP)

(73) Assignee: Sony Computer Entertainment Inc., Tokyo (JP)

( * ) Notice: Subject to any disclaimer, the term of this patent is extended or adjusted under 35 U.S.C. 154(b) by 339 days.

This patent is subject to a terminal disclaimer.

(21) Appl. No.: 12/621,112

(22) Filed: Nov. 18, 2009

(65) Prior Publication Data

US 2010/0142728 A1 Jun. 10, 2010

(30) Foreign Application Priority Data

Dec. 4, 2008 (JP) ................................. 2008-310317

(51) Int. Cl.
*H03G 5/00* (2006.01)
*H03G 3/00* (2006.01)
(52) U.S. Cl. ............. 381/101; 381/61; 381/98; 381/103
(58) Field of Classification Search .................... 381/61, 381/98, 103, 101; 700/94
See application file for complete search history.

(56) References Cited

U.S. PATENT DOCUMENTS

| 7,489,770 B2 | 2/2009 | Nemoto |
| 2007/0165809 A1 | 7/2007 | Nemoto |

FOREIGN PATENT DOCUMENTS

| JP | 2005204227 A | 7/2005 |
| JP | 2005269231 A | 9/2005 |
| JP | 2008085520 A | 4/2008 |

OTHER PUBLICATIONS

Office Action for corresponding Japanese Patent Application 2008-310317, dated Oct. 5, 2010.

*Primary Examiner* — Devona Faulk
*Assistant Examiner* — George Monikang
(74) *Attorney, Agent, or Firm* — Matthew B. Dernier, Esq.; Gibson & Dernier LLP (57) ABSTRACT

In a user terminal, a reproducing unit reads out from a music file memory unit a music file selected and input by a user and reproduces the music file. In a normal reproduction, an output unit outputs the reproduced sound as an audio. When a notification information reception unit receives information that needs to be noticed such as an e-mail or a phone call, a notification information analysis unit analyzes the setting of the information or notification sound and determines the degree of importance. A frequency band allocation unit selects from allocation patterns of frequency bands stored in an allocation information memory unit a pattern for the music and for the notification sound according to the degree of importance and the frequency band of the notification sound. An audio processing unit extracts and synthesizes the components of the frequency bands allocated to music and the notification sound, and the output unit outputs accordingly.

9 Claims, 6 Drawing Sheets

| IMPORTANCE | NOTIFICATION SOUND | E-MAIL AND NOTIFICATION DETAILS |
|---|---|---|
| HIGH | SWEEP TONE, SIREN TONE | DISASTER EMERGENCY NOTIFICATION TITLE INCLUDES THE WORD "EMERGENCY" SOURCE SET TO HIGH IMPORTANCE |
| MIDDLE | BEEP TONE | OTHER THAN THE ONES OF HIGH/LOW IMPORTANCE |
| LOW | MELODY TONE | FIXED PHRASE SET TO LOW IMPORTANCE DETERMINED TO BE A SPAM MAIL |

INFORMATION PROCESSING APPARATUS PROCESSING NOTIFICATION SOUND AND AUDIO-BASED CONTENTS, AND INFORMATION PROCESSING METHOD THEREOF

BACKGROUND OF THE INVENTION

1. Field of the Invention

The present invention relates to an information processing technique and particularly to an information processing apparatus including a function of reproducing an audio signal and an information processing method utilized in the information processing apparatus.

2. Description of the Related Art

In recent years, due to the improvement of compressibility of an audio signals, the increase in memory capacity, the enhancement of network environments, etc., there is an increased number of situations where music data is carried and enjoyed at different places. As one-segment partial reception services have become widely used, viewing TV programs by using mobile terminals has also become more generalized. Under any environment, there is always ambient sound that is produced. At the same time, information terminals that receives an e-mail, home electric appliances that have completed a process selected by a user, etc., all producing notification sounds indicating information accordingly, have become more common. In today's typical world, there are more occasions, regardless of a user's preference, to hear a sound such as audio or notification sounds produced by electric devices.

For example, when receiving a phone call or an e-mail while listening to music on a mobile phone, a notification sound indicating an incoming alert is generally output while the music is still playing. However, when the music is playing at a high volume, the notification sound may be undetected. In order to prevent the notification sound from being undetected, one possible option is to temporarily stopping the music while the notification sound is produced. However, it can be often annoying to have the music stopped for each unexpected incoming call or an e-mail. As described above, the notification sound is often produced unexpectedly regardless of the user's intention. Thus, it is not preferable to have such another sound produced while one enjoys contents that is audio-based, such as music, TV programs, or radio programs.

SUMMARY OF THE INVENTION

In this background, a purpose of the present invention is to provide a technique to ensure a notification sound is perceived in moderation without fail while the content with audio still plays.

One embodiment of the present invention relates to an information processing apparatus. The information processing apparatus comprises: a reproducing unit operative to reproduce an audio signal included in content; a notification sound production unit operative to produce a notification sound for notifying a user of predetermined information; a frequency band allocation unit operative to allocate frequency bands each to an audio signal being reproduced and to the notification sound in a different pattern when the notification sound needs to be produced while the reproducing unit is reproducing the audio signal; an audio processing unit operative to extract and then synthesize an allocated frequency band component individually from the audio signal reproduced by the reproducing unit and the notification sound produced by the notification sound production unit in a pattern of a frequency band allocated by the frequency band allocation unit; and an output unit operative to output the audio signal synthesized by the audio processing unit as an audio.

The term "pattern" is used to imply a variation in both width and a frequency band of bands to be allocated and bands not to be allocated in an audible frequency band. There may be multiple regions to be allocated or multiple regions not to be allocated in the audible frequency band.

Another embodiment of the present invention relates to an information processing method. The information processing method comprises: reading out from memory and then reproducing an audio signal included in content; allocating, when a notification sound for notifying a user of predetermined information needs to be produced while the audio signal is being reproduced, the frequency bands each to an audio signal being reproduced and to the notification sound in a different pattern; producing the notification sound; extracting and synthesizing an allocated frequency band component from each of a reproduced audio signal and a produced notification sound in the pattern of an allocated frequency band; and outputting a synthesized audio signal as an audio.

Optional combinations of the aforementioned constituting elements, and implementations of the invention in the form of methods, apparatuses, systems, and computer programs may also be practiced as additional modes of the present invention.

BRIEF DESCRIPTION OF DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

Figure 1:
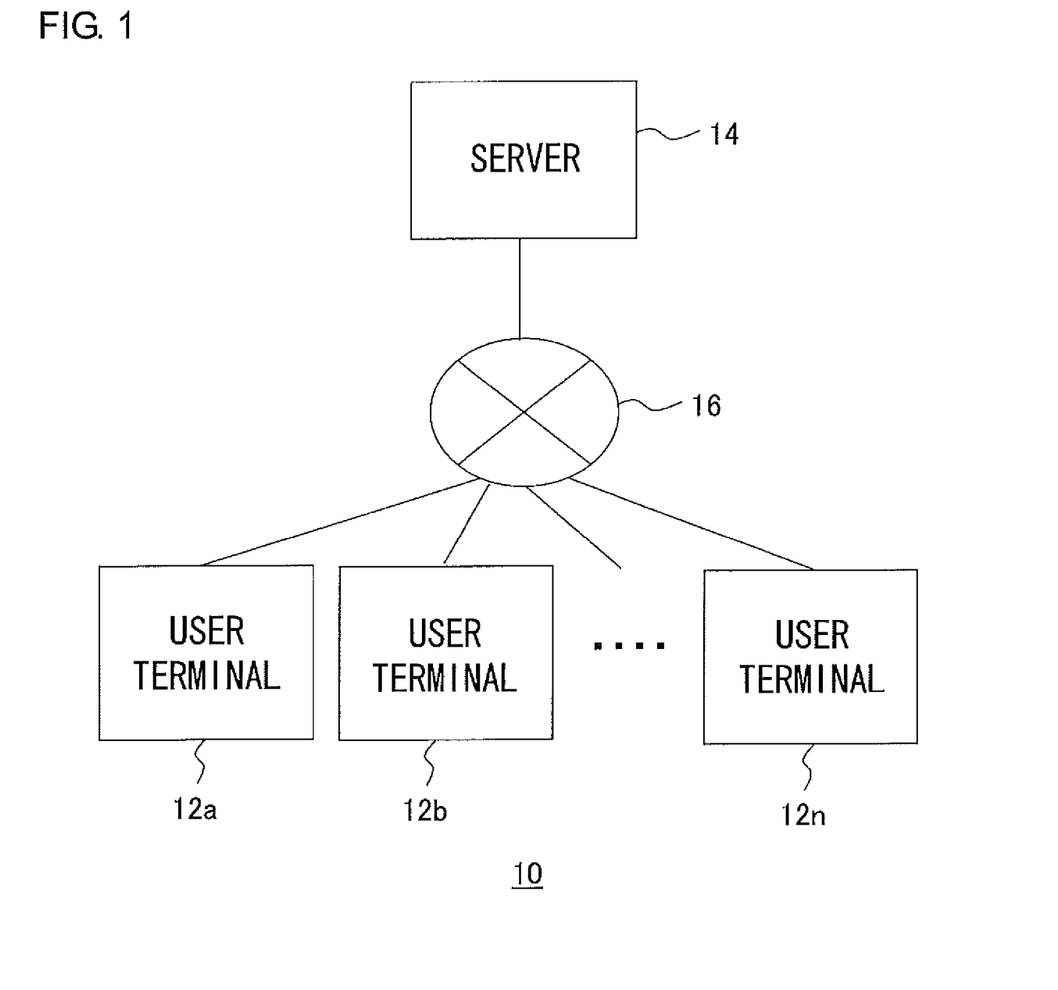
FIG. 1 is a view showing the configuration example of a system to which the embodiment can be applied.

FIG. 1 shows the configuration example of a system to which the embodiment can be applied. An information receiving system 10 has an embodiment where multiple user terminals 12a-12n are connected to a mail server 14 via a network 16. The user terminals 12a-12n may be any of, for example, mobile phones, mobile audio reproducing apparatuses, mobile information terminals, apparatuses that centrally control the audio signals of multiple electronic devices, etc., and include a function of notifying a user of other information while outputting main information that includes sounds.

In this environment, the user terminal 12a has a function of outputting sounds for music appreciation, TV program viewing, etc. The user terminal 12a also has a function of receiving, via a server 14, e-mails transmitted from, for example, another user terminal 12b or 12n via a network 16. When an email is received, the user terminal 12a produces a notification sound and notifies a user that the e-mail has been received.

The user terminal 12a may acquire various types of information other than e-mails via the network 16 and produce the notification sound at a predetermined timing. For example, the user terminal 12a produces the notification sound in accordance with a service that the user who operates the user terminal 12a subscribes to or with the function of each electronic device, such as an incoming phone call, an alarm from a home security system notifying if something is out of the ordinary at home, a notification from an electric appliance or electronic apparatus in a home, and a notification containing information related to stock trading. The notification source may be the user terminal 12a without going through the network 16. An alarm function and a timer function used for schedule management apply to this. In the following explanation, it is assumed that the information from the notification source is received via the network 16.

In the embodiment, reference is made to a process when a notification sound needs to be produced under the circumstance where the user is listening to the sound from music, a TV program, or the like by using the user terminal 12a in such an environment. In this case, an important notification is reliably made without being lost among music etc. while the user immerses himself/herself in music without interruption, and without making the user to miss an important conversation. More specifically, allocating respective predetermined frequency bands to the music and the notification sound and then outputting a mixture of the two allow both the music and the notification sound to be perceived. In the following explanations, sound data represents, but is not limited to, music data. The sound data may represent other data for audio signals as well, such as a human voice in comic story telling or a meeting, ambient sounds, sounds included in the broadcasting wave, or the like, or may represent a mixture thereof.

Figure 2:
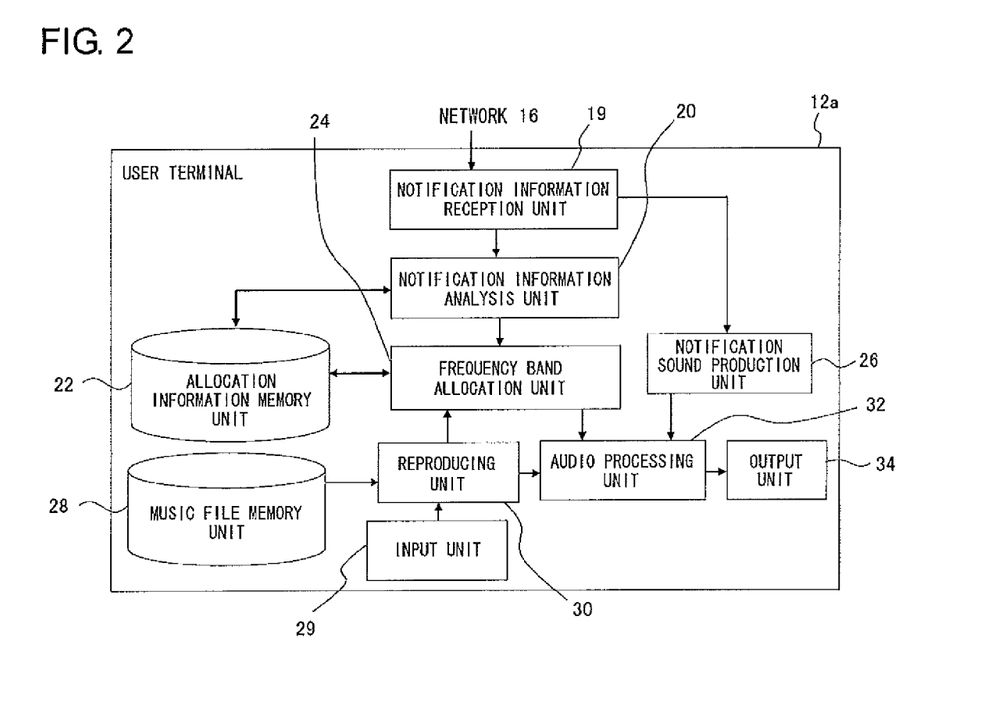
FIG. 2 is a view showing the detailed configuration of a user terminal in the embodiment.

FIG. 2 shows the detailed configuration of the user terminal 12a. The user terminal 12a includes a notification information reception unit 19 that receives, via the network 16, the information needing to be noticed such as an e-mail, a notification information analysis unit 20 that analyzes notification information, a frequency band allocation unit 24 that allocates music and a notification sound to appropriate frequency bands based on the analyzed notification information, and an allocation information memory unit 22 that stores information for determining an allocation pattern of the frequency bands.

The user terminal 12a further includes a music file memory unit 28 that stores a music file that can be reproduced by the user terminal 12a, an input unit 29 that receives a music selection input from the user, a reproducing unit 30 that reproduces a music file selected by the user, a notification sound production unit 26 that produces an original notification sound, an audio processing unit 32 that extracts and then mixes the components of the frequency bands respectively allocated to the audio signals of the music and the notification sound, and an output unit 34 that outputs mixed sounds or reproduced music as an audio.

In FIG. 2, the elements shown in functional blocks that indicate a variety of processes are implemented in hardware by any CPU (Central Processing Unit), memory, or other LSI's, and in software by a program loaded in memory, etc. Therefore, it will be obvious to those skilled in the art that the functional blocks may be implemented in a variety of manners by a combination of hardware and software.

The input unit 29, the music file memory unit 28, and the reproducing unit 30 may have the same configurations as those of an input apparatus, a memory apparatus, and a reproducing apparatus, respectively, that are provided in a general music reproducing apparatus. In other words, storing the music files encoded in a general encoding format such as MP3 in the music file memory unit 28, followed by the user inputting his/her selection by using the input unit 29 allows one of the files to be transmitted to the reproducing unit 30 and then decoded. Thus, the input unit 29 is provided with at least any one of a keyboard, a touch panel, a button, and the like, which a general electronic device has, and may further include a display apparatus that displays a selection screen for selecting music to be reproduced. In accordance with the encoding format of the music file, the reproducing unit 30 performs decoding and generates an audio signal by using a general method.

When the notification sound does not need to be produced, the audio signal reproduced by the reproducing unit 30 is output from the output unit 34 as an acoustic signal without undergoing the frequency band extraction process performed by an audio processing unit 32, which will be described hereinafter. Therefore, the output unit 34 may be configured with an audio output apparatus, such as built-in speakers, externally-connected speakers, or earphones, used for general electronic devices.

The notification information reception unit 19 receives, via the network 16, information needing to be noticed. As described above, the information needing to be noticed varies according to a function that can be realized by using the user terminal 12a or to a service the user can enjoy by using a network. The information indicating the type of the notification sound is added to the information that is received. Alternatively, the setting of the notification sound is stored in the user terminal 12a for each type of the information. The setting may be set by the user.

The notification sound production unit 26 produces a notification sound that is set in advance for the information received by the notification information reception unit 19. When no music is being reproduced in the reproducing unit 30 at the time of receipt of the information, the processes of the notification information analysis unit 20, the frequency band allocation unit 24, and the audio processing unit 32 may not be performed. The sound produced by the notification sound production unit 26 may be output directly from the output unit 34 as an acoustic signal. Therefore, the notification sound production unit 26 may be configured with a notification sound production apparatus used for a general electronic device.

Upon the receipt of the information needing to be noticed from the notification information reception unit 19, the notification information analysis unit 20 analyzes the information. For example, the frequency band or audio characteristics of a notification sound set so as to observe the information, or the header, title, and mail message of an e-mail, which is the information body, are subject to analysis. The analysis objects are set in advance. Based on the result of the analysis, the notification information analysis unit 20 determines the importance of the received information by checking it against information in an importance determination table stored in the allocation information memory unit 22.

Based on the importance of the received information, which is determined by the notification information analysis unit 20, the frequency band allocation unit 24 determines a focus value for determining the width of a frequency band to be allocated for each of the notification sound and the music that is being reproduced. The pattern of frequency bands to be finally allocated to the notification sound and the music is then determined. The focus value and the allocation pattern of a frequency range will be described in detail hereinafter. Based on the allocation pattern determined by the frequency band allocation unit 24, the audio processing unit 32 extracts respective components only of the frequency bands respectively allocated to the notification sound and the music, and then synthesizes them. The output unit 34 outputs the synthesized notification sound and music as an audio and then synthesizes.

An embodiment where frequency bands are allocated to two sounds, music and a notification sound, will be described. A human being recognizes a sound by two stages: the detection of the sound by the ears; and the analysis of the sound by the brain. For a human being to tell one sound from another, both produced concurrently from different sound sources, the acquisition of information, that is, segregation information is necessary that indicates that the sound sources are different in either of the two stages or in both of the two stages. For example, hearing different sounds with the right ear and the left ear means obtaining segregation information at the inner ear level, and the sounds are analyzed and recognized as different sounds by the brain. Sounds that are already mixed can be segregated at a brain level by checking the difference in a sound stream or tone quality against segregation information learned or memorized during one's lifetime and performing an analysis.

When hearing multiple sounds in a mixture through a pair of speakers, earphones, or the like, no segregation information can be obtained at the inner ear level, and the sounds are thus recognized as different sounds by the brain based on the differences in a sound stream or tone quality as described above. However, only a limited number of sounds can be distinguished in this manner. Thus, in order to generate an audio signal that can be eventually recognized by segregation even when the audio signal is mixed with another signal, frequency bands are allocated respectively to multiple sound sources and segregation information that works on the inner earn is artificially added to an audio signal.

Figure 3:
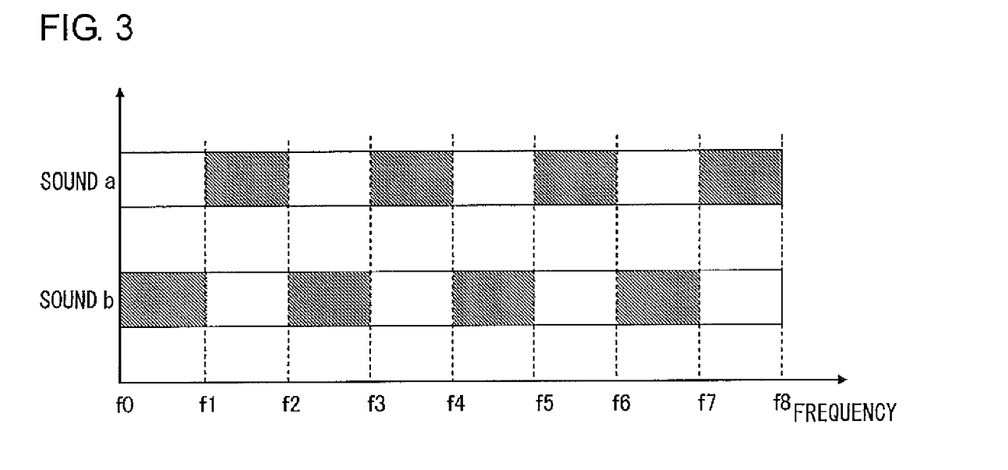
FIG. 3 is a view explaining the allocation of frequency bands in the embodiment.

FIG. 3 is a view explaining the allocation of frequency bands. The horizontal axis of the figure represents frequencies, and frequencies f0-f8 are set to be an audible band. The figure shows the situation where two audio sounds, sound a and sound b, are heard while both are mixed. In the embodiment, an audible band is divided into multiple blocks, and each block is allocated to at least any one of multiple audio signals. Then only a frequency component, which belongs to the allocated block, is extracted from each audio signal.

In FIG. 3, the audible band is divided into eight blocks at the frequencies f1-f7. For example, as shown by shaded areas, four blocks that are between the frequency f1 and the frequency f2, the frequency f3 and the frequency f4, the frequency f5 and the frequency f6, and the frequency f7 and the frequency f8 are allocated to the sound a, and four blocks that are between the frequency f0 and the frequency f1, the frequency f2 and the frequency f3, the frequency f4 and the frequency f5, and the frequency f6 and the frequency f7 are allocated to the sound b. For example, by setting the frequencies f1-f7, which are boundary frequencies of the blocks, to, for example, the boundary frequencies of some of twenty-four critical bands based on the Bark scale, the effect of dividing frequency bands can be enhanced.

A critical band is a frequency band range where the amount of the masking of other sound by a sound having a given frequency band range does not increase even when the frequency band width is further increased. Masking is a phenomenon of a threshold of hearing for a given sound increasing in the presence of other sound, in other words, a phenomenon of the sound becoming difficult to be perceived. The amount of masking is the amount of increase in the threshold of hearing. More specifically, those sounds that have different critical bands are difficult to be masked by one another. An adverse effect, for example, the masking of the frequency component of the sound b that belongs to the blocks of the frequencies f2-f3 by the frequency component of the sound a that belongs to the blocks of the frequencies f1-f2 can be controlled by dividing the frequency band by using the twenty-four critical bands of the Bark scale determined by an experiment. The same applies to other blocks, and as a result, the sound a and the sound b are identified as audio signals that barely cancel each other out.

The division into blocks may not depend on the critical bands. In any case, a reduction in frequency bands that overlap allows segregation information to be provided by using frequency resolution in the inner ear. The example shown in FIG. 3 illustrates blocks having almost the same band width; however, the band width may be changed in accordance with a frequency band in reality. For example, there may be a band range with two critical bands as one block and a band range with four critical bands as one block. How the division into blocks is conducted may be determined, for example, in consideration of general characteristics of a sound, such as consideration that a sound having a low frequency is difficult to be masked.

The embodiment provides a feature of ensuring a notification sound to be perceived while listening to a music. Thus, the allocation of the frequency band to the notification sound may be prioritized so as to prevent the situation where a frequency band that a notification sound does not originally ranges to is allocated to the notification sound, even when a notification sound has a narrow frequency band. Thus, the notification information analysis unit 20 also transmits information related to the original frequency band of a notification sound to the frequency band allocation unit 24.

On the other hand, the allocation of a frequency band for a music may be conducted in consideration of a characteristic frequency band. A characteristic frequency band is, for example, a frequency band that is important for the expression of the music such as a frequency band mainly used for the overall theme. When the frequency band to be allocated to the music is expected to be the same frequency band to be allocated to the notification sound, the band may be further divided and then equally allocated besides giving priority to the notification sound. The example shown in FIG. 3 illustrates a series of blocks being alternately allocated to the sound a and the sound b. However, the way of allocating the blocks is not limited to this, and, for example, two consecutive blocks may be allocated to the sound a.

Figure 4:
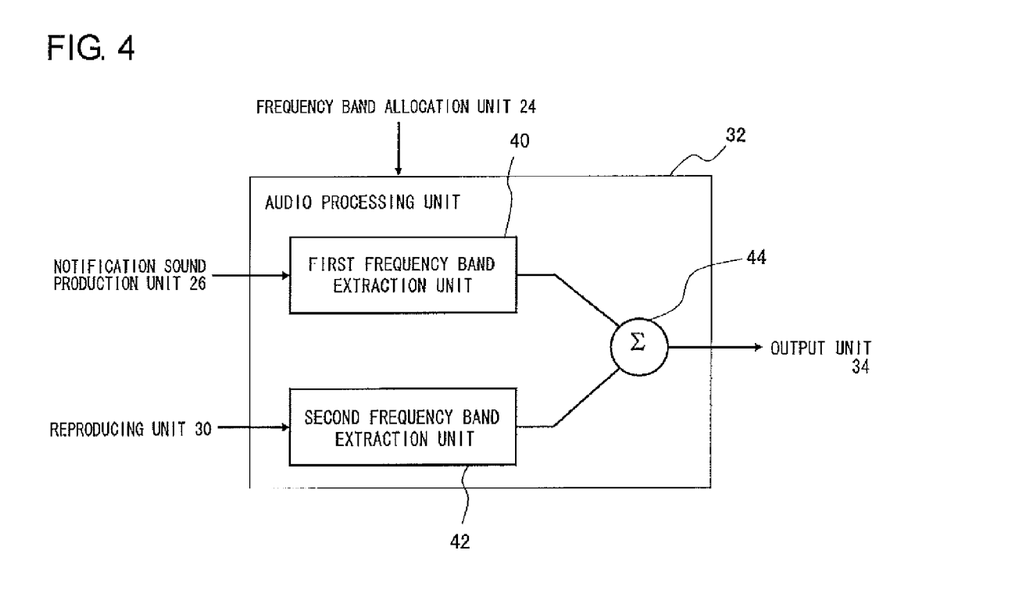
FIG. 4 is a view showing the detailed configuration of an audio processing unit in the embodiment.

FIG. 4 shows the detailed configuration of an audio processing unit 32. The audio processing unit 32 includes a first frequency band extraction unit 40, a second frequency band extraction unit 42, and a synthesizing unit 44. The first frequency band extraction unit 40 and the second frequency band extraction unit 42 each extract, from the audio signals of the notification sound and the music respectively entered from the notification sound production unit 26 and the reproducing unit 30, the respective frequency components allocated to each of the audio signals. The block information of the frequency band allocated to each of the notification sound and the music, which is entered from the frequency band allocation unit 24, in other words, allocation pattern information is set to the first frequency band extraction unit 40 and the second frequency band extraction unit 42. The audio signal components extracted by the first frequency band extraction unit 40 and the second frequency band extraction unit 42 are synthesized and then output by the synthesizing unit 44.

Figure 5:
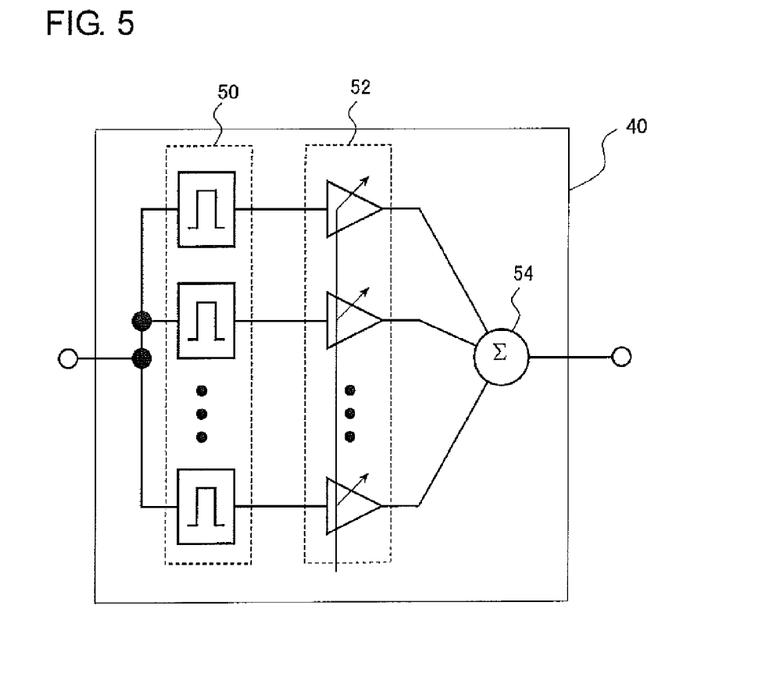
FIG. 5 is a view showing the detailed configuration of a first frequency band extraction unit in the embodiment.

FIG. 5 shows the detailed configuration of the first frequency band extraction unit 40. The second frequency band extraction unit 42 may have a similar configuration, and the configuration can be applied just by changing the allocation pattern of a frequency band. The first frequency band extraction unit 40 includes a filter bank 50, an amplitude adjusting unit 52, and a synthesizing unit 54. The filter bank 50 segregates the entered audio signal of the notification sound into blocks (eight blocks in the example of FIG. 3) of a frequency band as shown in FIG. 3. When segregating into N-number of blocks, the filter bank 50 is constituted with N-number of band-pass filters. To each band-pass filter, extracted frequency-band information for each block is set in advance.

The amplitude adjusting unit 52 sets the audio signal of each block that is output by each band-pass filter of the filter bank 50 to an amplitude that is set in advance. In other words, the amplitude is set to zero for a frequency band block that is not allocated, and the amplitude is set to be as it is for a frequency band block that is allocated. The synthesizing unit 54 synthesizes and then outputs the audio signal of each block for which amplitude adjustment is performed. Such a configuration allows for the acquisition of audio signals obtained by extracting frequency band components, each one allocated to each of the notification sound and the music. The frequency band allocation unit 24 inputs N-bit selection/non-selection information for the N-number of blocks in accordance with an allocation pattern, and each of N-number of amplitude adjustment circuits of the amplitude adjusting unit 52 needs to make an adjustment by referring to corresponding bit information so that the amplitude is set to 0 by a non-selected amplitude adjustment circuit.

Figure 6:
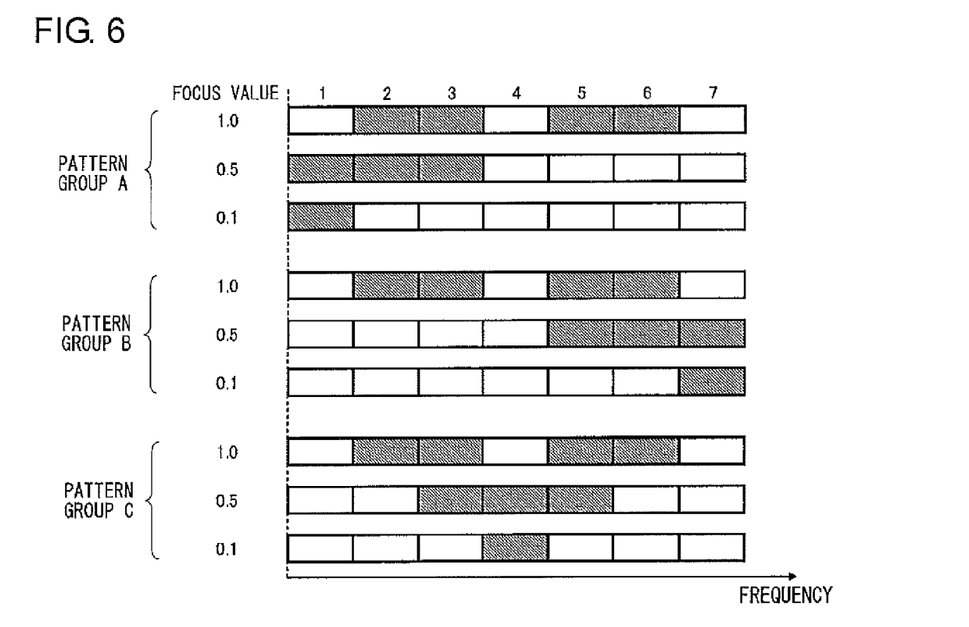
FIG. 6 is a view schematically showing the pattern of how blocks are allocated in the embodiment.

A detailed description will be made regarding how a frequency band is allocated by the frequency band allocation unit 24. In FIG. 3, frequency-band blocks are almost equally allocated to the "sound a" and the "sound b" for the explanation of a method for segregating and then recognizing multiple sound signals. On the other hand, the perceptibility of each of the sounds to be concurrently perceived can be adjusted by increasing or decreasing the number of blocks to be allocated. FIG. 6 schematically shows an example of the pattern of how blocks are allocated.

The figure shows an audible band divided into seven blocks. As in FIG. 3, the horizontal axis represents frequencies, and blocks are denoted as block 1, block 2, . . . , block 7 staring from the side with a low frequency band for the purpose of explanation. First, an attention is given to three allocation patterns from the top described as a "pattern group A." Among these patterns, the pattern at the top has the largest number of allocated blocks and thus provides the most perceptibility. A pattern on a lower level has less number of allocated blocks and thus provides a reduced perceptibility. The degree of the sound perception determined by the number of allocated blocks is referred to as the "focus value." The figure illustrates a value provided as the focus value to the left of each allocation pattern.

When the degree of the perceptibility of a given audio signal needs to be at the maximum level, that is, when the audio signal needs to be perceived most readily compared to other audio signals, an allocation pattern having a focus value of 1.0 is applied to the audio signal. In the "pattern group A" of the figure, four blocks are allocated to the same audio signal: a block 2; a block 3; a block 5; and a block 6.

When slightly reducing the degree of the perceptibility of the same audio signal, the allocation pattern is changed to an allocation pattern of, for example, a focus value of 0.5. In the "pattern group A" of the figure, three blocks are allocated: the block 1; the block 2; and the block 3. Similarly, when the degree of the perceptibility of the same audio signal needs to be at the minimum, that is, when the audio signal needs to be perceived in the least noticeable manner, the allocation pattern is changed to an allocation pattern of, for example, a focus value of 0.1. In the "pattern group A" of the figure, one block, which is the block 1, is allocated. In the embodiment, as described later, the focus values of the notification sound and the music are changed in a relative manner according to the degree of importance of information that needs to be noticed that is received by the notification information reception unit 19.

As shown in the figure, it is ensured that not all the blocks are allocated even to an audio signal showing the highest intensity with a focus value of 1.0, preferably. In the figure, the block 1, the block 4, and the block 7 are not allocated. This is because of the possibility that, for example, when the block 1 is also allocated to an audio signal of a focus value of 1.0, the frequency component of other audio signal with a focus value of 0.1 to which only the block 1 is allocated is masked. In the embodiment, it is preferable that an audio signal with a low focus value can be perceived while segregating multiple audio signals so as to be perceived. Therefore, it is ensured that a block allocated to an audio signal with a low focus value is not allocated to an audio signal with a high focus value.

The above explanation is made based on the "pattern group A." However, there are various allocation patterns even for the same focus value as shown in the "pattern group B" and the "pattern group C." When acquiring information regarding the frequency band of a notification sound from the notification information analysis unit 20, the frequency band allocation unit 24 selects the best allocation pattern from a group of allocation patterns that are prepared in advance in the allocation information memory unit 22 so that a frequency band that is quite different from the frequency band of a notification sound is not allocated even for an audio signal with the lowest focus value.

Similarly for a music, the best allocation pattern from a group of allocation patterns that are prepared in advance in the allocation information memory unit 22 is selected so that a distinctive frequency band can be extracted to a maximum extent even for an audio signal with the lowest focus value. The distinctive frequency band of the music is acquired from, for example, metadata that is stored along with a music file in the music file memory unit 28. Direct information regarding the distinctive frequency band may be acquired at this time. Alternatively, a rule for deriving a recommended pattern group from general bibliographical information, for example, the genre, the name of a musical instrument, a female voice or male voice, may be set in advance in the allocation information memory unit 22. In any pattern group, a block that is allocated for the focus value of 0.1 is not allocated for the focus value of 1.0. The reason therefore is as previously stated.

An allocation pattern that is stored in the allocation information memory unit 22 may include that for focus values of other than 0.1, 0.5, or 1.0. The number of blocks, however, is limited, and allocation patterns that can be prepared in advance are thus limited. Thus, in the case of a focus value that is not stored in the allocation information memory unit 22, an allocation pattern is determined by interpolating the allocation patterns having near focus values and stored in the allocation information memory unit 22. As a method of interpolating, a frequency band to be allocated is adjusted by further dividing a block, or the amplitude of a frequency component that belongs to a given block is adjusted.

Thus, as described above, the frequency band allocation unit 24 is operative to allocate frequency bands each to an audio signal being reproduced and to the notification sound in a different pattern when the notification sound needs to be produced while the reproducing unit 30 is reproducing the audio signal, such that a total bandwidth of frequency bands, each to be allocated to the audio signal being reproduced and to the notification sound, is adjusted in accordance with the degree of importance of the received information determined by the notification information analysis unit 20.

Figure 7:
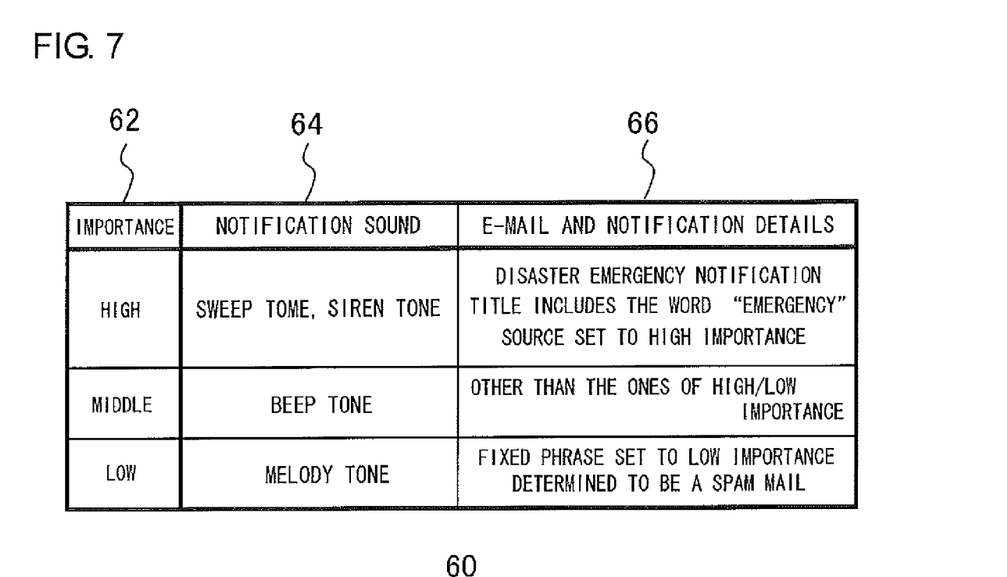
FIG. 7 is a view showing an example of an importance determination table stored in an allocation information memory unit in the embodiment.

The determination of the importance of received information by the notification information analysis unit 20 is described in the following. FIG. 7 shows an example of an importance determination table, which is stored in an allocation information memory unit 22, referred to by the notification information analysis unit 20. The reasons for the importance determination shown in the figure are conceptually described for the purpose of ease of understanding. In reality, the reasons may be set more specifically with, for example, the value of a frequency, the type of a tone, and/or set text data. An importance determination table 60 includes an importance column 62, a notification sound column 64, and an e-mail and notification-detail column 66.

The details described in the notification sound column 64 and in an e-mail and notification-detail column 66 shows features that can be obtained as the results of respective analyses by the notification information analysis unit 20 analyzing the setting of a notification sound and the details of received e-mails or notifications. The features are differentiated by three levels of importance, "high," "middle," and "low," shown in the importance column 62. For example, when the information indicating the setting of a notification sound is a "sweep tone" or a "siren tone" can be acquired from received information, the importance is set to "high." In this case, a "notification sound" is subject to analysis. Thus, the type of received information does not need to be specified. On the other hand, when the received information is an e-mail and when the title of the e-mail includes the word "emergency" or when the e-mail is from an important person such as a client, the importance is set to "high."

With regard to the title of the e-mail, a specific word such as "emergency" can be extracted by analyzing by using a general document analysis technique such as morphological analysis. With regard to an e-mail source, a user sets in advance an address of a source that is considered to be important, and the degree of the importance of the e-mail source is determined by, for example, the comparison with the address of the source included in the header of an e-mail received by the notification information analysis unit 20. Besides e-mails, a notification from a notification system is determined to be a "disaster emergency notification" by an address or ID that is set in advance. The same as for the e-mail source applies to a source of a call.

Similarly, when the setting of a notification sound is a "beep tone," the importance is set to "middle," and when the setting of a notification sound is a "melody tone," the importance is set to "low." On the other hand, when an e-mail is found to include a fixed phrase set by a user as a result of morphological analysis of the body text of the e-mail, or when an e-mail is determined to be a spam mail by the analysis by using a Bayesian filter, the importance is set to "low." When analysis is performed based on an email or notification content, the importance is set to "middle" except for the example cases stated above. The contents of the table shown in FIG. 7 are for illustrative purposes and are accordingly set in accordance with the type of received information or with the preference of a user.

In the above explanation, any one of the notification sound column 64 and the e-mail and notification-detail column 66 is referred to so as to search for any feature that applies, based on the information selected from the notification sound and the content of the information which are received by the notification information analysis unit 20. However, the importance may be determined based on the condition of a notification sound and the content of information combined.

Figure 8:
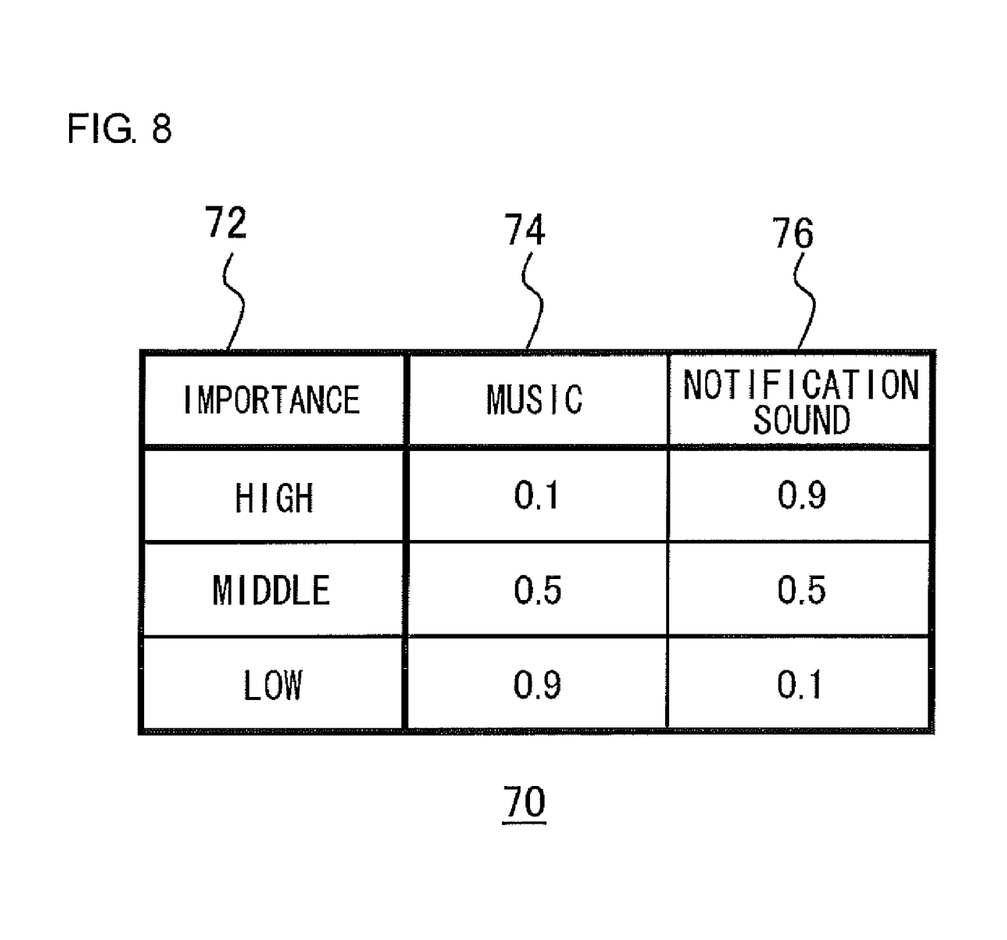
FIG. 8 is a view showing an example of a focus value table stored in the allocation information memory unit in the embodiment.

When the notification information analysis unit 20 determines the importance by referring to the importance determination table 60, the frequency band allocation unit 24 determines the focus values of the music and the notification sound based on the information. FIG. 8 shows an example of a focus value table, which is stored in an allocation information memory unit 22, referred to by the frequency band allocation unit 24. A focus value table 70 includes an importance column 72, a music column 74, and a notification sound column 76. The frequency band allocation unit 24 searches for the importance of received information from the importance column 72 and acquires optimum focus values of music and the notification sound from the music column 74 and the notification sound column 76, respectively, under the condition.

For example, when the importance of the information is determined to be "high," the focus value of the music is set to "0.1," and the focus value of the notification sound is set to "0.9." In this case, while the music is output in a small frequency range so as to be moderately audible, the notification sound is output in a larger frequency range so as to be emphasized. Similarly, when the importance is at "middle," both the focus value of the music and the focus value of the notification sound are set to "0.5." This means that the frequency band of the music is lowered to some extent and that the notification sound is output with almost the same degree of perceptibility. When the importance is at "low," the focus value of the music is set to "0.9," and the focus value of the notification sound is set to "0.1." This provides a situation where the notification sound is moderately audible with almost no change in the frequency band of the music.

In the embodiment, a sound is not adjusted merely by the amplitude but by the frequency band, and the adjustment is performed under a rule such as that the frequency band of a notification sound is given a priority. Therefore, for example, in the case of information having a low importance, the notification sound can be perceived without fail by a user while changing the condition of the music being played. Thus, the frequency band allocation unit 24 selects both a focus value and an allocation pattern of a frequency band as stated above in accordance with the sound. Therefore, even when the focus values of the music and the notification sound are both "0.5" while the importance is at "middle," selecting an allocation pattern from different patter groups where the music and the notification sound do not cancel each other out allows two sounds to be independently perceived with almost the same degree of perceptibility.

The values described in each column of the focus value table 70 of FIG. 8 are for an illustrative purpose. The values may be determined by performing a test on actual perceptibility. In the figure, the sum of the focus values of the music and the notification sound is set to be 1 for each degree of importance. However, the sum is not limited to 1.

Figure 9:
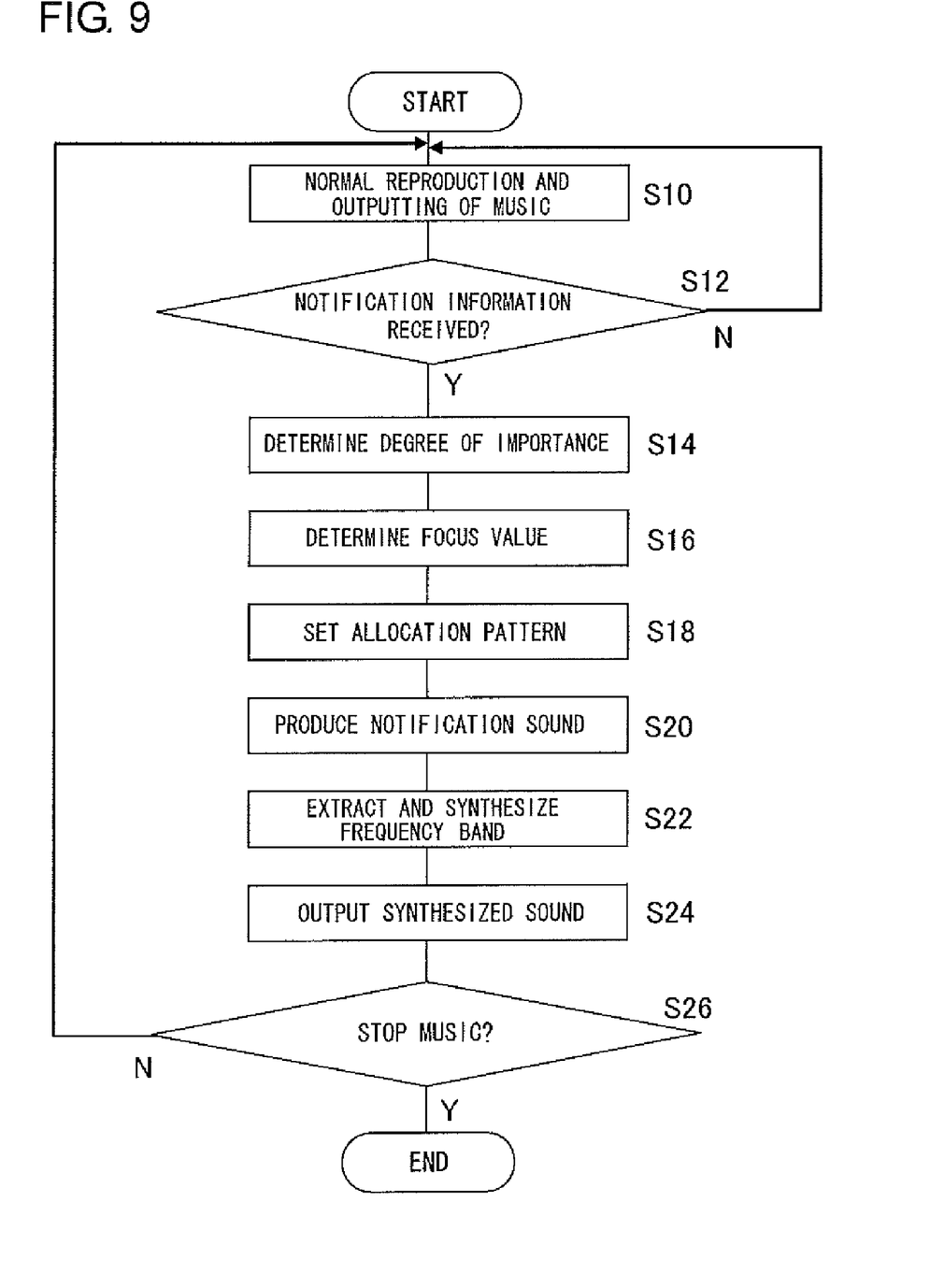
FIG. 9 is a flowchart showing the sequence of processing, by a user terminal, the information needing to be noticed while music is being reproduced in the embodiment.

A detailed description will now be made of the operation by the configurations described thus far. FIG. 9 is a flowchart showing the sequence of processing the information that needs to be noticed while music is being played by the user terminal 12a. When a user enters through the input unit 29 an input for selecting a music file stored in the music file memory unit 28, the reproducing unit 30 reads out and reproduces the file, and the output unit 34 outputs the audio (S10). While the notification information reception unit 19 does not acquire any information that needs to be noticed (N in S12), normal reproduction and outputting of the music both continue (S10). All the frequency bands are allocated to the music at this time.

When the notification information reception unit 19 receives the information that needs to be noticed (Y in S12), the notification information analysis unit 20 acquires predetermined information such as the setting of the notification sound included in the information, the content of an e-mail received as information, the source of a call, and the type of the information, and then determines the degree of the importance of the information by referring to the importance determination table 60 (S14). The frequency band allocation unit 24 then determines the focus values of the music being played and the notification sound by referring to the focus value table 70 based on the degree of the importance (S16).

The frequency band allocation unit 24 then selects an allocation pattern group that is suitable for both the music and the notification sound from allocation pattern groups of the frequency bands stored in the allocation information memory unit 22 and sets to respective frequency band extraction units of the audio processing unit 32 the information of an allocation pattern determined by the selected allocation pattern group and focus values (S18). The allocation pattern group of the music may be determined at the point when the reproduction is started, regardless of the presence of the notification sound. Alternatively, the perceptibility of the notification sound may be given a priority by allocating a pattern group to the music, which is different from that of notification sound, after a suitable pattern group is determined for the notification sound.

On the other hand, the notification sound production unit 26 produces a notification sound that is set in the received information (S20). The audio processing unit 32 then extracts and synthesize the frequency band components of the notification sound and the music by using the set allocation pattern (S22). The output unit 34 then outputs a synthesized sound (S24). When the user enters through the input unit 29 an input for requesting to stop the music (Y in S26), the previous process related to a sound is stopped. In this procedure, the user is possibly using the user terminal 12a to open an e-mail or to answer a phone call. However, such processes are omitted in the figure.

When the user does not enter an input for requesting to stop the music (N in S26), the normal reproduction and outputting process of the music continue. When the set notification sound is of a kind that keeps ringing, after the user enters an input requesting to stop the notification sound at any stage after S24, the process switches to the normal reproduction and outputting process of the music in S10. Similarly to the normal reproduction before the concurrent production of the notification sound, the normal reproduction at this time is conducted under the condition where all the frequency bands are allocated to the music. It is assumed that the normal reproduction and outputting process of the music in S10 continue right before a synthesized sound is output in S24.

According to the embodiment described above, when information that needs to be noticed is received while a user is enjoying, for example, music, television, or a radio, by using a terminal, the music being played and a notification sound are concurrently perceived by allocating a frequency band suitable for each of the music and the notification sound and by outputting accordingly. By ensuring that at least a part of the frequency band to be allocated to the notification sound is different from the frequency band to be allocated to the music, the notification sound can be perceived while the music is being enjoyed. As a result, a notification can be concurrently perceived without preventing the user from enjoying music or making the user to miss an important part of the audio of the TV program. The continuity of the music can be kept since the music is not temporarily stopped by the notification sound.

In the process of allocating a frequency band, the frequency band of the notification sound is checked by checking the setting thereof, and the frequency band not included for the notification sound is ensured not to be allocated to the notification sound. This reduces the occurrence of situations where the components of a notification sound are not included in the extracted frequency band components or where a notification sound is washed out by music.

Received information used for the production of the notification sound is analyzed, and the degree of the importance of the information is then determined. Based on the degree of importance, the number of blocks of frequency bands to be allocated is adjusted in a relative manner for the music and the notification sound. With this, for example, whether the information is the one that needs to be urgently taken care of, the one that is important but not urgent, or the one that is not so important or urgent can be determined only by the notification sound. In this case, by adjusting not only the frequency band of the notification sound but also the frequency band of the music, the importance of the notification sound can be perceived almost under the same condition even when wild music such as a rock is being played or when soft music such as a ballad is being played. Therefore, the occurrence of a situation can be prevented where the notification sound is not perceived as important due to the low perceptibility thereof caused by the music washing out the notification sound.

Described above is an explanation based on the embodiments of the present invention. These embodiments are intended to be illustrative only and it will be obvious to those skilled in the art that various modifications to constituting elements and processes could be developed and that such modifications are also within the scope of the present invention.

What is claimed is:

1. An information processing apparatus comprising:
   a reproducing unit operative to reproduce an audio signal included in content;
   a notification sound production unit operative to produce a notification sound for notifying a user of predetermined information;
   a notification information analysis unit operative to receive information needing to be noticed using the notification sound and determine a degree of importance of the received information by analyzing the received information and by checking against a condition that is set in advance for determining a degree of importance of information;
   a frequency band allocation unit operative to allocate frequency bands each to an audio signal being reproduced and to the notification sound in a different pattern when the notification sound needs to be produced while the reproducing unit is reproducing the audio signal, such that a total bandwidth of frequency bands, each to be allocated to the audio signal being reproduced and to the notification sound, is adjusted in accordance with the degree of importance of the received information determined by the notification information analysis unit;

an audio processing unit operative to extract and then synthesize an allocated frequency band component individually from the audio signal reproduced by the reproducing unit and the notification sound produced by the notification sound production unit in a pattern of a frequency band allocated by the frequency band allocation unit; and an output unit operative to output the audio signal synthesized by the audio processing unit as an audio.

2. The information processing apparatus according to claim 1, wherein:

the notification information analysis unit is further operative to identify the frequency band of the notification sound to be produced by the notification sound production unit, and the frequency band allocation unit preferentially allocates the frequency band of the notification sound identified by the notification information analysis unit to the notification sound.

3. The information processing apparatus according to claim 1 further comprising:

a notification information reception unit operative to receive the information needing to be noticed from a server connected via a network and providing the received information to the notification information analysis unit, wherein the notification sound production unit produces, by the notification information reception unit receiving the information needing to be noticed, a notification sound that is set by the information.

4. The information processing apparatus according to claim 1, wherein, as the degree of the importance becomes higher, the frequency band allocation unit increases the total bandwidth of the frequency band to be allocated to the notification sound and decreases the total bandwidth of the frequency band to be allocated to the audio signal being reproduced.

5. The information processing apparatus according to claim 1, wherein the condition for determining the degree of importance is to determine the degree of importance by the sound type of the notification sound that is set by the received information.

6. The information processing apparatus according to claim 1, wherein the condition for determining the degree of importance is to determine the degree of importance by whether or not a source of an e-mail or phone call, which is the information needing to be noticed, is a person set by a user.

7. The information processing apparatus according to claim 1, wherein the condition for determining the degree of importance is to determine the degree of importance by whether or not an e-mail, which is the information needing to be noticed, includes a fixed phrase set by a user.

8. An information processing method comprising:

reading out from memory and then reproducing an audio signal included in content;

receiving information needing to be noticed using a notification sound, the notification sound being produced while the audio signal is being reproduced and when a user of predetermined information needed to be notified, and determining a degree of importance of the received information by: (i) analyzing the received information, and (ii) checking against a condition that is set in advance for determining a degree of importance of information;

allocating frequency bands each to an audio signal being reproduced and to the notification sound in a different pattern, such that a total bandwidth of frequency bands, each to be allocated to the audio signal being reproduced and to the notification sound, is adjusted in accordance with the determined degree of importance of the received information;

producing the notification sound;

extracting and synthesizing an allocated frequency band component from each of a reproduced audio signal and a produced notification sound in the pattern of an allocated frequency band; and outputting a synthesized audio signal as an audio.

9. A non-transitory computer readable medium encoded with a computer program, comprising:

a module operative to read out from memory and then reproduce an audio signal included in contents;

a module operative to receive information needing to be noticed using a notification sound, the notification sound being produced while the audio signal is being reproduced when a sure of predetermined information needs to be notified, and determine a degree of importance of the received information by: (i) analyzing the received information, and (ii) checking against a condition that is set in advance for determining a degree of importance of information;

a module operative to allocate frequency bands each to an audio signal being reproduced and to the notification sound in a different pattern, such that a total bandwidth of frequency bands, each to be allocated to the audio signal being reproduced and to the notification sound, is adjusted in accordance with the determined degree of importance of the received information;

a module operative to produce the notification sound;

a module operative to extract and synthesize an allocated frequency band component from each of a reproduced audio signal and a produced notification sound in the pattern of an allocated frequency band; and a module operative to output a synthesized audio signal as an audio.

* * * * *

UNITED STATES PATENT AND TRADEMARK OFFICE
CERTIFICATE OF CORRECTION

PATENT NO. : 8,295,509 B2
APPLICATION NO. : 12/621112
DATED : October 23, 2012
INVENTOR(S) : Shinichi Honda and Kosei Yamashita It is certified that error appears in the above-identified patent and that said Letters Patent is hereby corrected as shown below:

Col. 14, claim 8, line 7, should read "predetermined information needs..." instead of "predetermined information needed".

Col. 14, claim 9, line 8, should read "and when a user..." instead of "and when a sure".

Signed and Sealed this
Twelfth Day of February, 2013

Teresa Stanek Rea
*Acting Director of the United States Patent and Trademark Office*